United States Patent [19]

Tsukamoto

[11] Patent Number: 5,643,833

[45] Date of Patent: Jul. 1, 1997

[54] METHOD OF MAKING A CONTACT HOLE IN A SEMICONDUCTOR DEVICE

[75] Inventor: Masanori Tsukamoto, Kanagawa, Japan

[73] Assignee: Sony Corporation, Tokyo, Japan

[21] Appl. No.: 495,268

[22] Filed: Jun. 27, 1995

Related U.S. Application Data

[63] Continuation of Ser. No. 295,550, Aug. 25, 1994, abandoned.

[30] Foreign Application Priority Data

Aug. 31, 1993 [JP] Japan .................... 5-216754

[51] Int. Cl.$^6$ ............................... H01L 21/311
[52] U.S. Cl. .................. 437/195; 437/228; 156/656.1
[58] Field of Search ...................... 437/186, 187, 437/195, 228, 228 I, 228 W; 156/656.1, 657.1; 430/313, 314, 317, 318

[56] References Cited

U.S. PATENT DOCUMENTS

| | | |
|---|---|---|
| 3,884,698 | 5/1975 | Kakihama et al. |
| 4,070,689 | 1/1978 | Coleman et al. |
| 4,795,501 | 1/1989 | Stanbery ................ 437/2 |
| 5,037,777 | 8/1991 | Mele et al. ............. 437/195 |
| 5,130,259 | 7/1992 | Bahraman ............... 437/48 |
| 5,441,914 | 8/1995 | Taft et al. .............. 437/189 |
| 5,486,719 | 1/1996 | Sugiura et al. ........... 437/978 |

FOREIGN PATENT DOCUMENTS

| | | |
|---|---|---|
| 4-133450 | 5/1992 | Japan . |
| 4-206817 | 7/1992 | Japan . |
| 4-234109 | 8/1992 | Japan . |
| 5-160081 | 6/1993 | Japan . |

OTHER PUBLICATIONS

Z. Chen et al., IEEE Trans. Electron Dev., 40 (6) (1993) 1161, ". . . SiO2/SiN Antireflection Coating for Si Solar Cells" Jun. 1993.

R. Mehrorta et al., SPIE Proc. Abstract, 1463 (1991) 487, "Reduction of the Standing Wave Effect . . . " Mar. 1991.

K.H. Kusters et al, Symp. VLSI Technol. 1987, p. 93, "A High Density 4Mbit dRAM Process . . . " May 1987.

S. Subhanna et al., IEDM '93 Proc., p. 441, "A Novel Borderless Contact . . . " Dec. 1993.

Japanese Patent Abstract 06-005536, H. Tsukamoto, inventor.

S. Wolf "Silicon Processing For VLSI Era" vol. 2 1990, pp. 144-149, 398-399.

Transaltion of JP 4-206817.

Primary Examiner—Charles L. Bowers, Jr.
Assistant Examiner—Leon Radomsky
Attorney, Agent, or Firm—Hill, Steadman & Simpson

[57] ABSTRACT

A method of manufacturing a semiconductor device with multi-layer interconnections is disclosed. The method includes the steps of: forming a first electrically conductive interconnection layer on an insulating layer formed on a lower interconnection layer; forming an insulating layer on the first electrically conductive interconnection layer; forming an antireflection layer on the insulating layer; patterning the first electrically conductive interconnection layer, the insulating layer and the antireflection layer to form a stacked film composed of the first electrically conductive interconnection layer, the insulating layer and the antireflection layer; forming a sidewall on the stacked film; forming an interlayer insulating layer on entire surface of the stacked film having the sidewall formed thereon and the insulating layer; forming a contact hole to expose a selected portion of the lower interconnection layer using the sidewall as a mask; and depositing a second electrically conductive interconnection layer in the contact hole at the exposed portion of the lower interconnection layer.

6 Claims, 9 Drawing Sheets

EFFECT OF STEP dPR1≠dPR2

S:SUBSTRATE
In:e.g. Poly-Si
PR:RESIST

METHOD OF MAKING A CONTACT HOLE IN A SEMICONDUCTOR DEVICE

This application is a continuation of application Ser. No. 08/295,550, filed Aug. 25, 1994, abandoned.

BACKGROUND OF THE INVENTION

1. Field of the Invention

This invention relates to a method of manufacturing a semiconductor device employed for reducing standing wave effects.

2. Description of Related Art

A stepper as a pattern projecting device used for photolithography employs a single wavelength KrF excimer laser with a wavelength of 248 nm as a light source and has a lens NA of approximately 0.37 to 0.42.

However, if exposure is carried out with the stepper, the single wavelength of the light source generates a phenomenon called standing wave effect. The generation of the standing wave is caused by light interference within a resist film. That is, the interference is caused within a film of a resist PR by an incident light P and a reflected light R from the boundary between the resist PR and a substrate S, as shown in FIG. 1. Consequently, the amount of light absorbed in the resist changes in accordance with the resist thickness, as shown in FIG. 2. The amount of light absorbed in the resist indicates the amount of light absorbed in the resist itself excluding the amount of a light reflected on the surface, a light absorbed in any metal or a light radiated from the resist. The standing wave effect depends upon a ratio of a change $\Delta A$ in the amount of light absorbed in the resist to a change $A$ in the resist thickness, as shown in FIG. 3. This $\Delta A/A$ ratio is called a swing ratio.

In an actual device, pits and lands exist on the substrate surface. For instance, a recess composed of polysilicon or the like exists on the substrate surface, as shown in FIG. 4. For this reason, if the resist PR is applied thereon, the resist thickness differs between the upper side and the lower side of the step. In short, the resist thickness $d_{PR2}$ above the recess is smaller than the resist thickness $d_{PR1}$ of the other portion. Since the standing wave effect differs in accordance with the resist thickness, the amount of light absorbed in the resist affected by the standing wave effect also changes. Therefore, the size of a resist pattern produced after exposure and development differs above and below the step.

In order to reduce the above-described standing wave effect, use of antireflection layers 92 as shown in FIG. 5 has been considered to be effective. Conventionally, the antireflection layers 92 are formed below insulating layers 33 composed of offset oxidation films or the like.

A conventional semiconductor device to reduce the standing wave effect has first electrically conductive interconnection layers 91, and the antireflection layers 32, the insulating layers 33, interlayer insulating layers 34 and a second electrically conductive interconnection layer 35 which are formed on the first electrically conductive interconnection layers 31. The second electrically conductive interconnection layer 35 is bonded via a contact hole to the lower layer, that is, an N-type impurity diffused region 38 formed on the surface of a silicon substrate 37 in the example of FIG. 5.

Meanwhile, in the semiconductor device thus formed, the insulating layer 33 composed of the offset oxidation film or the like is diminished by etching and pre-processing for forming the contact hole 36. Therefore, it is necessary to deposit the insulating layer 33 to be relatively thick in consideration of irregularity in the etching. However, the thick insulating layer 33 generates a large step, and lithography and reactive ion etching (RIE) to the second electrically conductive interconnection layer 35 are difficult.

The antireflection layer 32 remains as it is. Therefore, if the antireflection layer 32 is formed by the low-temperature CVD method, such as $Si_xO_yN_z$, containing hydrogen and water, the hydrogen and water are changed by heat treatment, deteriorating characteristics of devices such as a transistor.

If the insulating layer 33 is formed by the high-temperature CVD method, such as LP-TEOS, the antireflection layer 32 formed below the insulating layer 33 is optically transformed, disturbing satisfactory patterning by lithography.

OBJECT AND SUMMARY OF THE INVENTION

In view of the above-described status of the art, it is an object of the present invention to provide a method of manufacturing a semiconductor device whereby it is possible to restrict diminution of the insulating film.

It is another object of the present invention to provide a method of manufacturing a semiconductor device whereby it is possible to realize restriction of the standing wave effect and satisfactory patterning, and to prevent deterioration in properties of devices such as the transistor.

According to the present invention, there is provided a method of manufacturing a semiconductor device with multi-layer interconnections, including the steps of: forming a first electrically conductive interconnection layer on an insulating layer formed on a lower interconnection layer; forming an insulating layer on the first electrically conductive interconnection layer; forming an antireflection layer on the insulating layer; patterning the first electrically conductive interconnection layer, the insulating layer and the antireflection layer to form a stacked film composed of the first electrically conductive interconnection layer, the insulating layer and the antireflection layer; forming a sidewall on the stacked film; forming an interlayer insulating layer on entire surface of the stacked film having the sidewall formed thereon and the insulating layer; forming a contact hole to expose a selected portion of the lower interconnection layer using the sidewall as a mask; and depositing a second electrically conductive interconnection layer in the contact hole at the exposed portion of the lower interconnection layer.

According to the present invention, there is also provided a method of manufacturing a semiconductor device with multi-layer interconnections, including the steps of: forming a first electrically conductive interconnection layer on an insulating layer formed on a lower interconnection layer; sequentially stacking an insulating layer and an antireflection layer on the first electrically conductive interconnection layer; patterning the antireflection layer and the insulating layer; etching the patterned antireflection layer and the first electrically conductive interconnection layer to form a stacked film composed of an interconnection layer with an insulating layer stacked thereon; forming a sidewall on the stacked film; forming an interlayer insulating layer on entire surface of the stacked film having the sidewall formed thereon and the insulating layer; forming a contact hole to expose a selected portion of the lower interconnection layer using the sidewall as a mask; and depositing a second electrically conductive interconnection layer in the contact hole at the exposed portion of the lower interconnection layer.

In the above methods of manufacturing a semiconductor device, the lower interconnection layer is an impurity diffused region formed by introducing impurities into a semiconductor substrate.

The antireflection layer is an $Si_xO_yN_z$ film or an $Si_xN_y$ film formed by plasma CVD.

The antireflection layer is an $Si_xO_yN_z$ film or an $Si_xN_y$ film having a reflection refractive index (real part of refractive index) n=2.4±0.6 and an absorption refractive index (imaginary part of refractive index) k=0.7±0.2.

The first electrically conductive interconnection layer is a polycide layer having silicide and a polycrystalline silicon layer stacked thereon.

In the method of manufacturing a semiconductor device according to the present invention, as the antireflection layer is formed on the insulating layer formed on the first electrically conductive interconnection layer, the antireflection layer is not optically transformed by formation of the insulating layer.

The patterning in forming the stacked film composed of the first electrically conductive interconnection layer, the insulating layer and the antireflection layer is carried out with a resist provided on the antireflection layer. Therefore, satisfactory patterning can be carried out, restricting the standing wave effect.

When the sidewall is formed on the stacked film formed by the patterning, the antireflection layer is located above the insulating layer. Therefore, the antireflection layer can be removed or made thinner by etching back in forming the sidewall.

After the interlayer insulating layer is formed on the entire surface of the stacked film having the sidewall formed thereon and the lower interconnection layer, the contact hole is formed to expose the selected portion of the lower interconnection layer using the sidewall as a mask. Therefore, the thickness of the antireflection layer can be further reduced, and diminution of the insulating layer can be prevented. If the $Si_xO_yN_z$ film is used as the antireflection layer in forming the contact hole 10, the etchrate is much lower than when $SiO_2$ is used as the insulating layer. Thus, the $Si_xO_yN_z$ film serves as an etching stopper.

In the other method of manufacturing a semiconductor device according to the present invention, as the antireflection layer is formed on the insulating layer formed on the first electrically conductive interconnection layer, the antireflection layer is not optically transformed by formation of the insulating layer.

Also, since a resist is provided on the antireflection layer in patterning the antireflection layer and the underlying insulating layer, the standing wave effect can be restricted and satisfactory patterning can be carried out.

Since the antireflection layer can be removed when the first electrically conductive interconnection layer is removed using the antireflection layer remaining after the patterning as a mask, any hydrogen and water contained in the antireflection layer are eliminated. Thus, deterioration in characteristics of devices such as the transistor can be prevented.

DETAILED DESCRIPTION OF THE PREFERRED EMBODIMENTS

Two embodiments of the method of manufacturing a semiconductor device according to the present invention, hereinafter referred to the method of manufacturing a semiconductor device of the first embodiment and the method of manufacturing a semiconductor device of the second embodiment, will now be described with reference to FIGS. 6 to 20.

The method of manufacturing a semiconductor device of the first embodiment is first described with reference to FIGS. 6 to 13.

Figure 1:
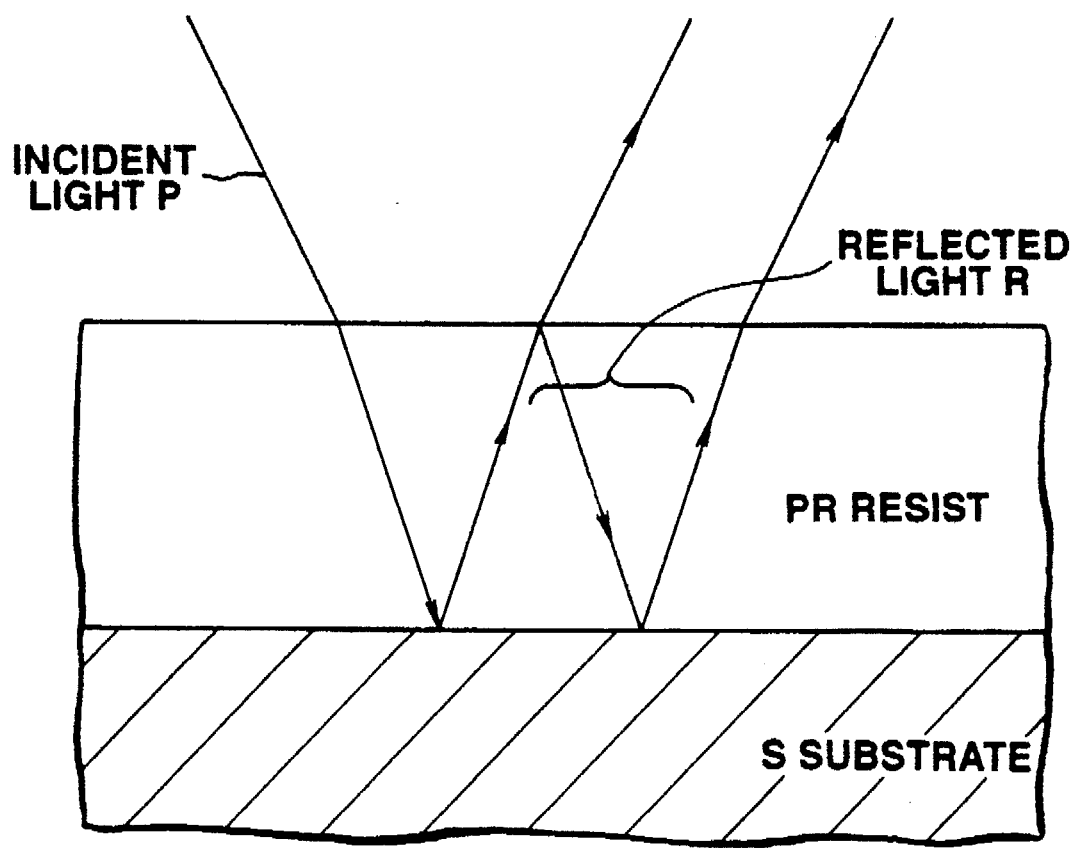
FIG. 1 is a view showing light interference within a resist film.
Figure 2:
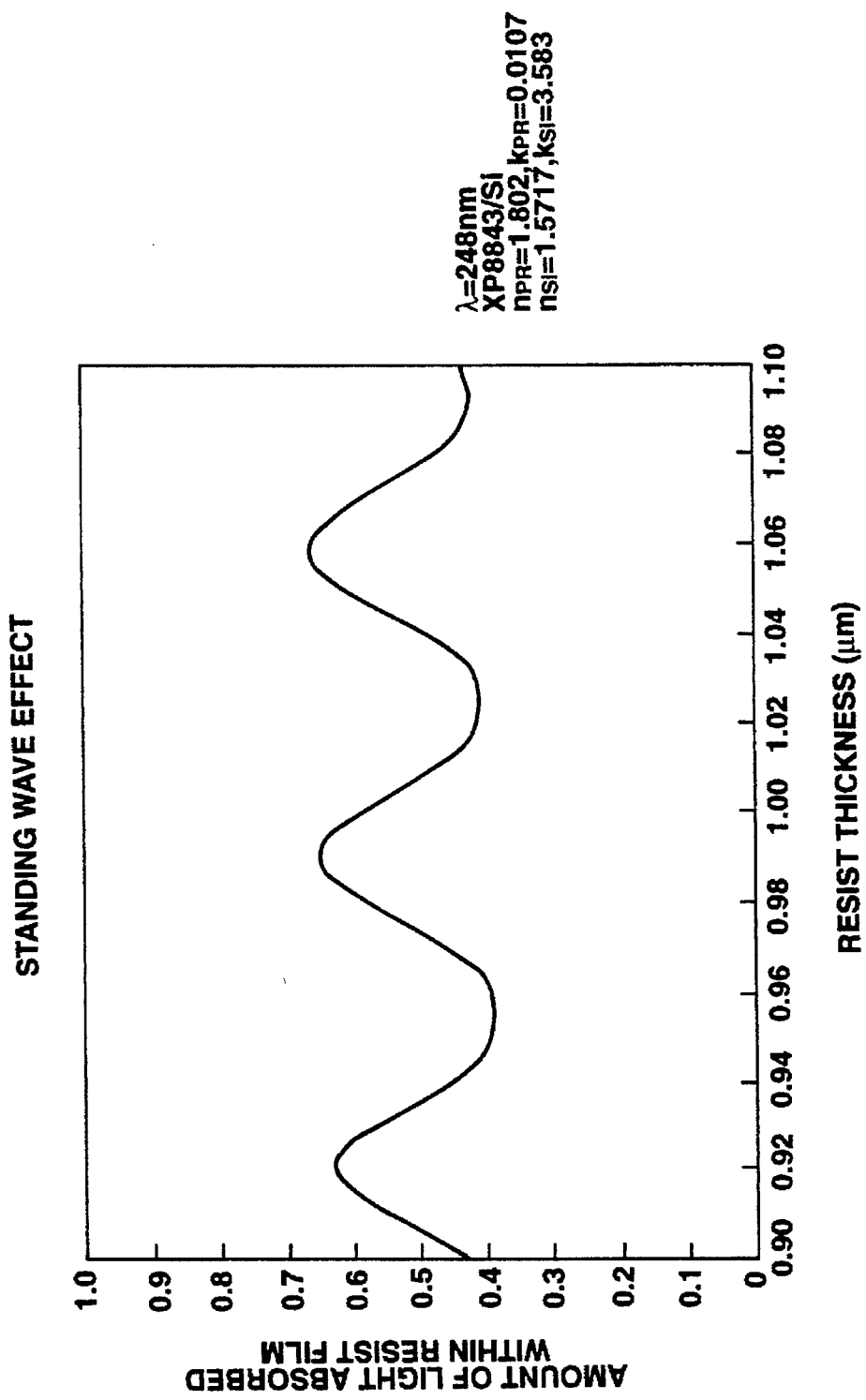
FIG. 2 is a graph showing the amount of light absorbed in the resist in relation to resist thickness.
Figure 3:
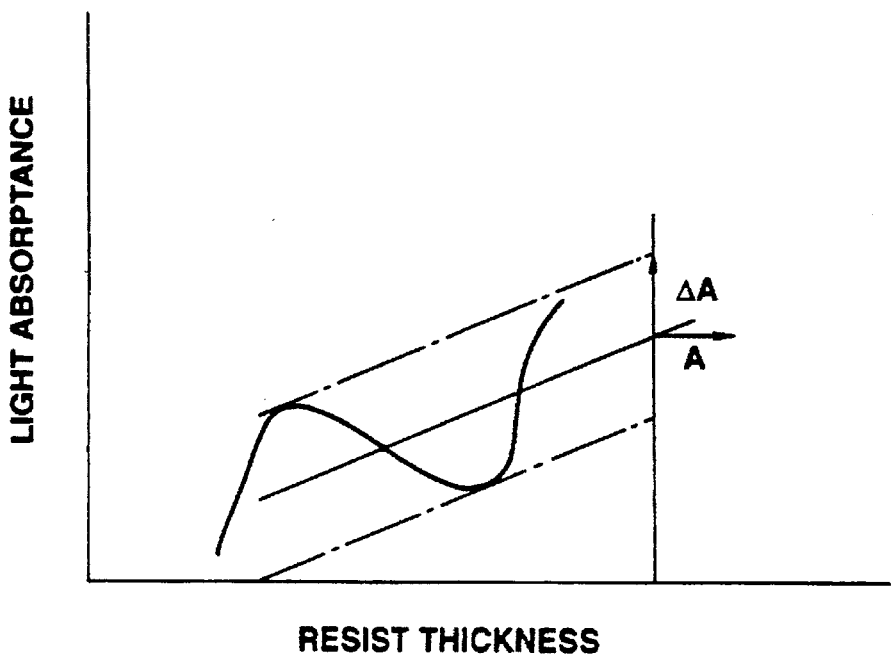
FIG. 3 is a graph for explaining the standing wave effect.
Figure 4:
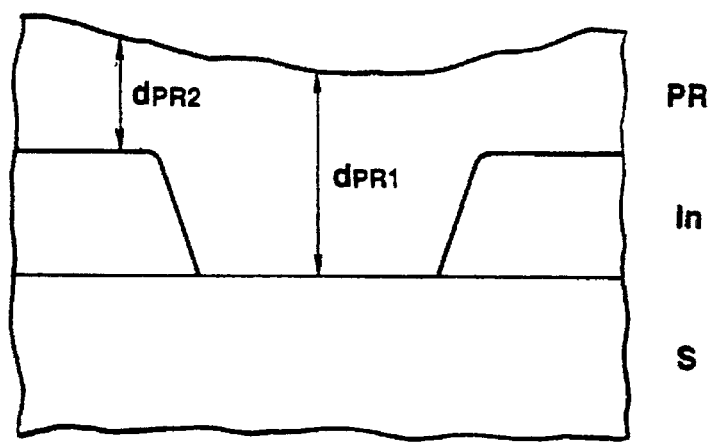
FIG. 4 is a view showing effects of the step.
Figure 5:
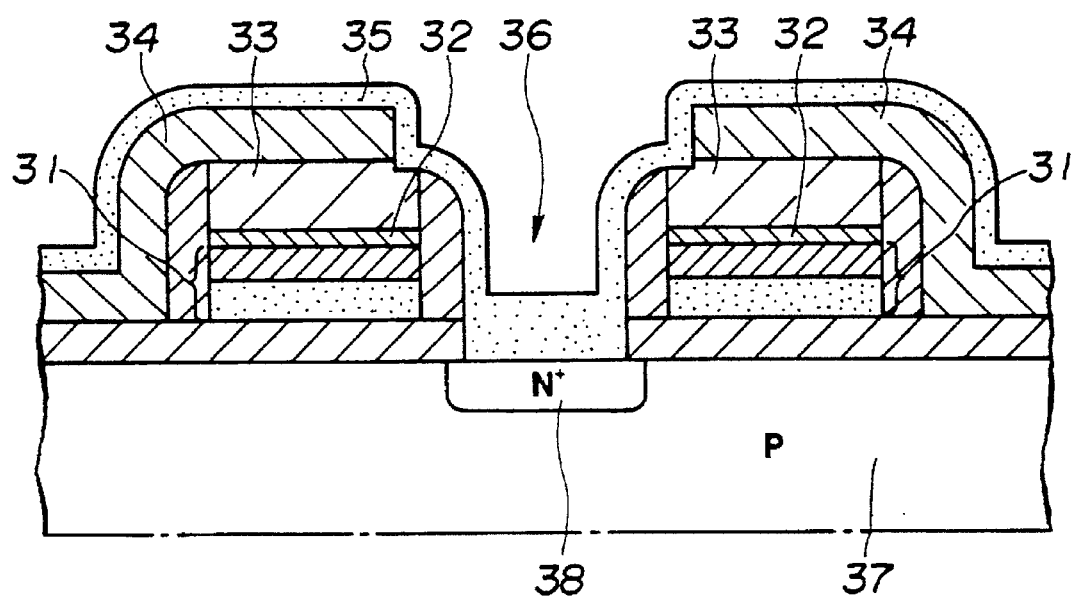
FIG. 5 is a view showing the structure of a semiconductor device produced by a conventional method of manufacturing a semiconductor device.
Figure 6:
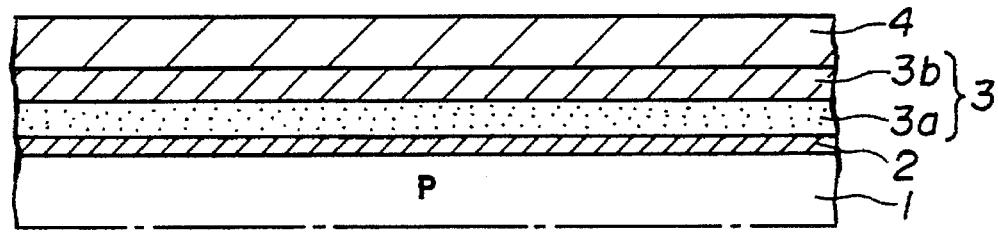
FIG. 6 is a view for explaining a process of forming an offset oxidation film in a method of manufacturing a semiconductor device according to a first embodiment of the present invention.

As shown in FIG. 6, a P-type silicon substrate is thermally oxidized to form a thin thermal oxidation film 2 on the silicon substrate. Then, a polycrystalline silicon layer 3a in which an n-type impurity is introduced is formed with a thickness of approximately 50 nm on the silicon substrate 1 with the thermal oxidation film 2 between them, by the CVD method. Then, a tungsten (W)—silicide layer 3b is formed with a thickness of approximately 50 nm on the polysilicon layer 3a by the CVD method. These polysilicon layer 3a and the upper tungsten-silicide layer 3b form a tungsten (W)—polycide layer 3, which is hereinafter referred to as a first electrically conductive interconnection layer 3.

An insulating layer 4 composed of TEOS or $SiO_2$ is formed with a thickness of approximately 170 nm on the first electrically conductive interconnection layer 3 by the LP-CVD method. The insulating layer 4 serves as an offset oxidation film for assuring a formation width of a sidewall as later described. Consequently, the insulating layer 4 is referred to as the offset oxidation film 4.

Figure 7:
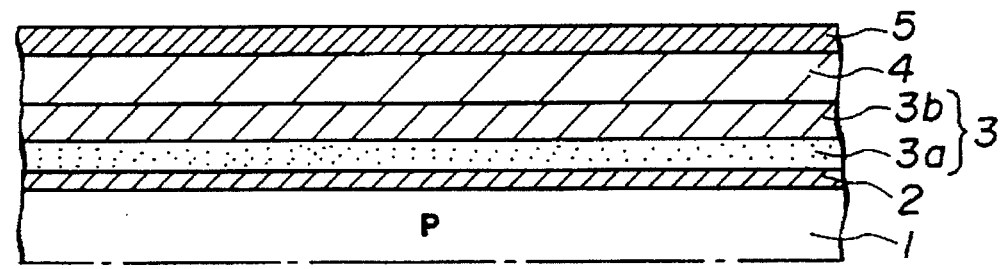
FIG. 7 is a view for explaining a process of forming an antireflection layer in the method of manufacturing a semiconductor device according to the first embodiment of the present invention.

As shown in FIG. 7, an antireflection layer 5 composed of $Si_xO_yN_z$ is formed with a thickness of approximately 24 nm on the surface of the offset oxidation film 4, at a deposition temperature of approximately 360° C. by the plasma CVD method using an $SiH_4/N_2O$ mixed gas.

In the present first embodiment, the antireflection layer 5 having the thickness of 24 nm is formed by forming the $Si_xO_yN_z$ film having a reflection refractive index n=2.4 ±0.6 and an absorption refractive index k=0.7 ±0.2, by the plasma CVD method using the $SiH_4/N_2O$ mixed gas.

Figure 8:
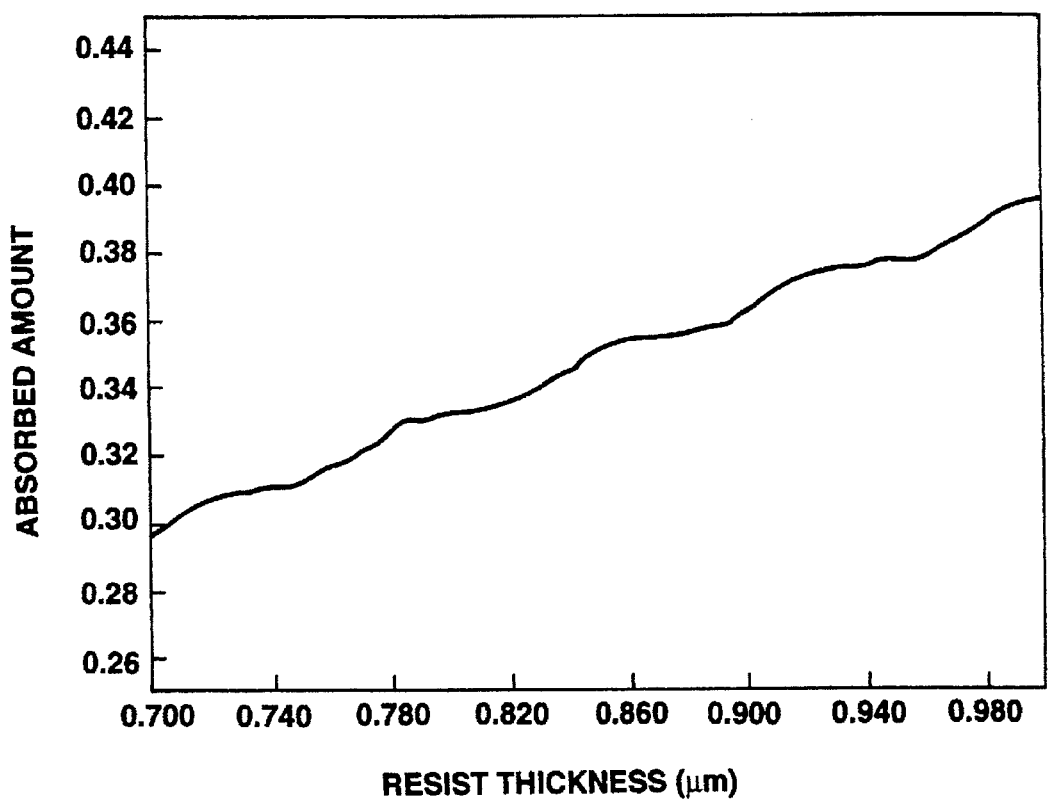
FIG. 8 is a graph for explaining setting of resist thickness suitable for the antireflection layer used in the first and second embodiments.

Particularly, with a reflection refractive index n=2.06, an absorption refractive index k=0.71 and a thickness of 24 nm, the standing wave effect is at the minimum level. The amount of light absorbed in the resist in relation to the resist thickness is shown in FIG. 8. In the present first embodiment, the swing ratio ΔA/A is 1% or less with a resist thickness of 0.84 μm. The standing wave effect is smaller as the swing ratio ΔA/A is smaller. In the first embodiment, with the resist thickness of 0.84 μm provided on the antireflection layer 5, the standing wave effect can be minimum, allowing satisfactory patterning to be carried out.

Figure 9:
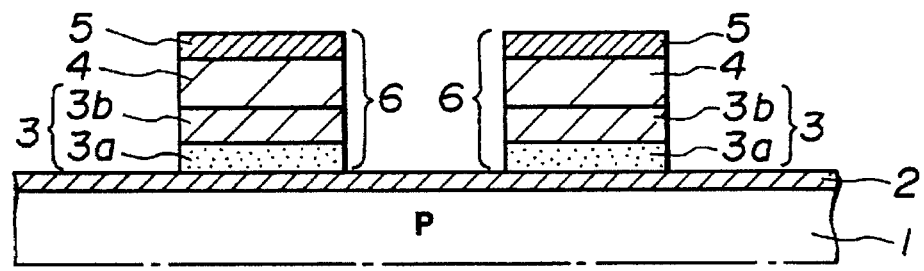
FIG. 9 is a view for explaining a process of forming a stacked film in the method of manufacturing a semiconductor device according to the first embodiment of the present invention.

Using the resist thus patterned as a mask, the antireflection layer 5 and the offset oxidation film 4 are etched by reactive ion etching (RIE) using a $CH_4/O_2$ gas. Then, the first electrically conductive interconnection layer 3 is etched by RIE using a $Cl_2/O_2$ gas, to form a stacked film 6 composed of the remaining first electrically conductive interconnection layer 3, offset oxidation film 4 and antireflection layer 5, as shown in FIG. 9.

Figure 10:
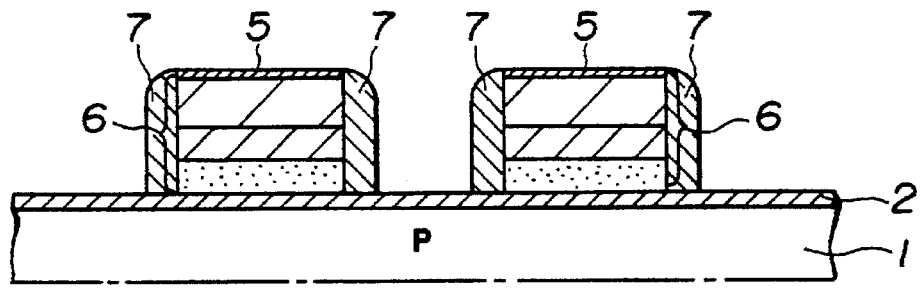
FIG. 10 is a view for explaining a process of forming a sidewall in the method of manufacturing a semiconductor device according to the first embodiment of the present invention.

After $SiO_2$ or TEOS is deposited with a thickness of 100 to 150 nm on the stacked film 36, etching back is carried out using a $CF_4/O_2$ gas to form a sidewall 37, as shown in FIG. 10. In this etching back, the antireflection layer 5 can be diminished by overetching.

Figure 11:
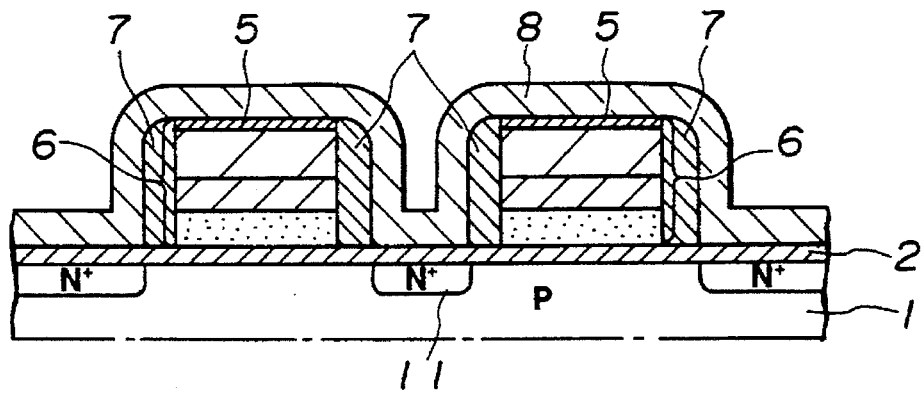
FIG. 11 is a view for explaining a process of forming an interlayer insulating layer after forming an impurity diffused region in the method of manufacturing a semiconductor device according to the first embodiment of the present invention.

Then, n-type impurities such as phosphorus ions are selectively implanted in a required region of the region surrounded by the sidewall 7, as shown in FIG. 11, to form an n-type impurity diffused region on the surface of the silicon surface in the required region. Then, an interlayer insulating layer 8 composed of TEOS or $SiO_2$ is formed with a thickness of approximately 80 nm on the entire surface by the CVD method.

Figure 12:
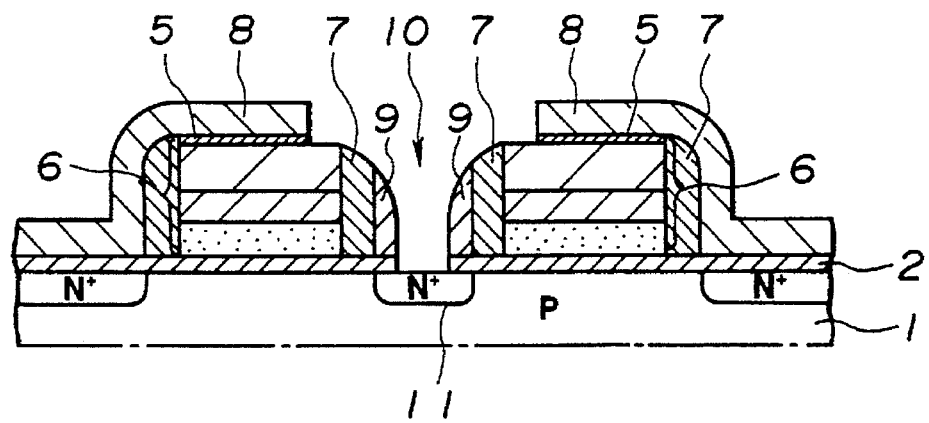
FIG. 12 is a view for explaining a process of forming a contact hole in the method of manufacturing a semiconductor device according to the first embodiment of the present invention.

A contact hole 10 to expose the silicon substrate 1 is formed as shown in FIG. 12. In further detail, after a resist, not shown, is formed on the interlayer insulating layer 8, a portion corresponding to the contact hole is opened by patterning with lithography. The portion exposed from the opening in the resist is etched by RIE using a $CF_4/O_2$ gas. At this point, a second sidewall 9 is formed on the inner side of the sidewall 7, and the contact hole 10 reaching the silicon substrate 1 is formed in a self-aligned manner. Overetching is carried out in this RIE. However, the antireflection layer 5 composed of $Si_xO_yN_z$ has a lower etch rate than that of the interlayer insulating layer 8 composed of $SiO_2$. Thus, the antireflection layer 5 serves as an etch resistant protective layer.

Figure 13:
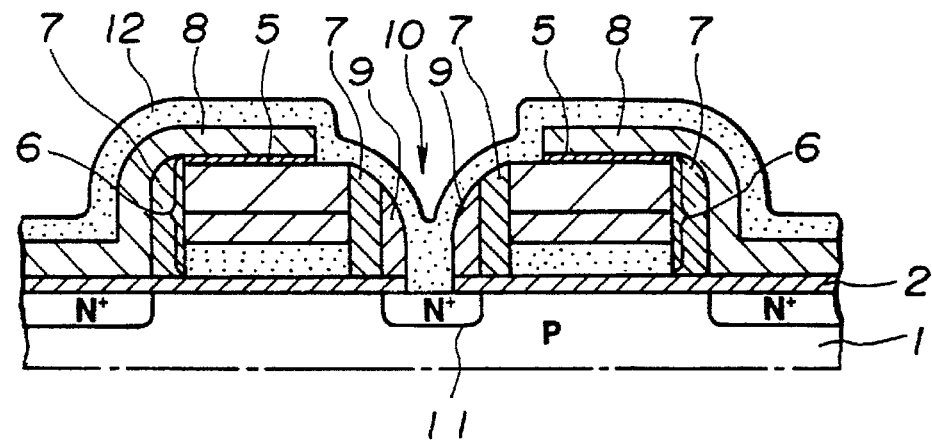
FIG. 13 is a view for explaining a process of forming a second electrically conductive interconnection layer in the method of manufacturing a semiconductor device.

Finally, after the natural oxidation film is removed with hydrofluoric acid in pre-processing, a second electrically conductive interconnection layer 12 composed of a polycrystalline silicon layer is formed with a thickness of approximately 50 nm by the CVD method, to form a semiconductor device of the first embodiment, as shown in FIG. 13.

In the present first embodiment, since the antireflection layer 5 is formed on the offset oxidation film 4 formed on the first electrically conductive interconnection layer 3, the antireflection layer is not optically transformed by the formation of the offset oxidation film 4.

Since the patterning in forming the stacked film 8 composed of the first electrically conductive interconnection layer 3, the offset oxidation film 4 and the antireflection layer 5 is carried out with a resist provided on the antireflection film 5, the standing wave effect can be restricted and satisfactory patterning can be carried out.

Since the antireflection layer 5 is located above the offset oxidation film 4 in forming the sidewall ? on the stacked film 6 after the patterning, the antireflection layer 5 can be removed or diminished in thickness by etching back in forming the sidewall 7.

The contact hole 10 extending to the underlying interconnection layer 1 is formed with the sidewall 7 as a mask after the interlayer insulating layer 8 is formed on the entire surface of the stacked film 6 having the sidewall 7 formed thereon and the underlying interconnection layer 1. Therefore, the antireflection layer 5 can be diminished further in thickness, and diminution of the interlayer insulating layer 8 can be prevented. Also, if an $Si_xO_yN_z$ film is used as the offset oxidation film 4 in forming the contact hole 10, the etchrate is much lower than when $SiO_2$ is used for the offset oxidation film 4. Therefore, the etching can be stopped.

The method of manufacturing a semiconductor device of the second embodiment will now be described with reference to FIGS. 14 to 20. As methods of manufacturing and materials of films and layers shown in FIGS. 14 to 20 are similar to those of the first embodiment shown in FIGS. 6, 7 and 9 to 13, these methods and materials are denoted by the same reference numerals without further explanation.

Figure 14:
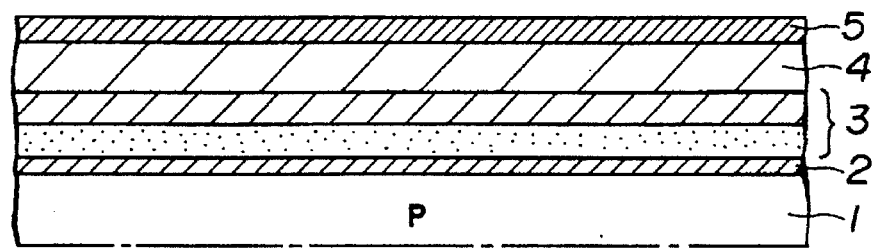
FIG. 14 is a view for explaining a process of forming an antireflection layer in a method of manufacturing a semiconductor device according to the second embodiment of the present invention.

According to the method of manufacturing a semiconductor device of the second embodiment, a tungsten (W)— polycide layer 3 is first formed as a first electrically conductive interconnection layer 3 on a P-type silicon substrate 1 having a thin thermal oxidation film 2 formed on the surface thereof, and then an offset oxidation film 4 as an insulating layer is formed on the first electrically conductive interconnection layer 3, with an antireflection layer 5 formed on the offset oxidation film 4, as shown in FIG. 14.

As in the first embodiment, the antireflection layer 5 is formed with a thickness of 24 nm by forming a film of $Si_xO_yN_z$ film having a reflection refractive index n=2.4±0.6 and an absorption refractive index k=0.7±0.2 by plasma CVD using an $SiH_4/N_2O$ mixed gas.

Particularly with a reflection refractive index n=2.06, an absorption refractive index k=0.71 and a thickness of 24 nm, the standing wave effect can be at the minimum level, as in the first embodiment. That is, patterning can be carried out with a resist thickness on the antireflection layer 5 being set to 0.84 μm in accordance with characteristics of the amount of light absorbed in relation to the resist thickness shown in FIG. 8.

Figure 15:
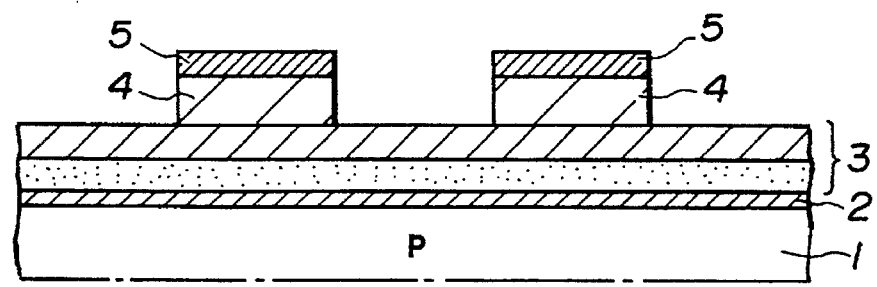
FIG. 15 is a view for explaining a process of etching the antireflection layer and an offset oxidation film in the method of manufacturing a semiconductor device according to the second embodiment of the present invention.

Then, patterning is carried out by lithography using a resist, not shown, on the antireflection layer 5. Since the antireflection layer 5 causes the standing wave effect to be the minimum for lithography, satisfactory patterning can be carried out. With the patterned resist used as a mask, the antireflection layer 5 and the offset oxidation film 4 are etched by RIE using a $CF_4/O_2$ gas as shown in FIG. 15. The resist is separated by $O_2$ plasma.

Figure 16:
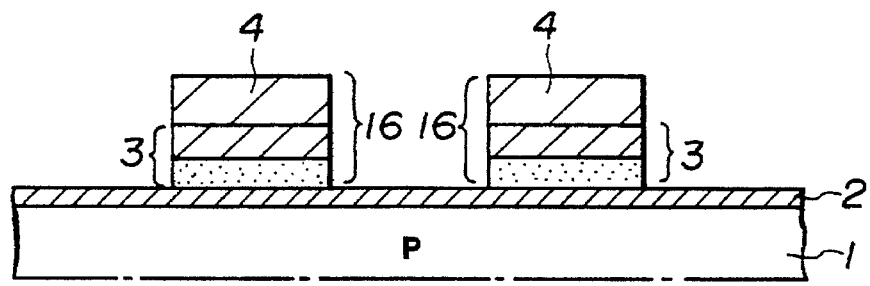
FIG. 16 is a view for explaining a process of removing or thinning the antireflection layer in etching the first electrically conductive interconnection layer in the method of manufacturing a semiconductor device according to the second embodiment of the present invention.

Then, with the antireflection layer 5 and the offset oxidation film 4 shown in FIG. 15 as masks, the first electrically conductive interconnection layer 3 is etched by RIE using a $Cl_2/O_2$ gas. As the antireflection layer 5 is composed of $Si_xO_yN_z$, the antireflection layer 5 is removed or diminished in thickness by the etching. FIG. 16 shows a state of a stacked film 16 composed of the remaining first electrically conductive interconnection layer 3S and the offset oxidation film 4 with the antireflection layer 5 removed. As the antireflection layer 5 composed of $Si_xO_yN_z$ is removed as shown in FIG. 16, deterioration in properties of devices such as a transistor due to hydrogen and water contained in the antireflection layer 5 can be prevented in the present second embodiment.

Figure 17:
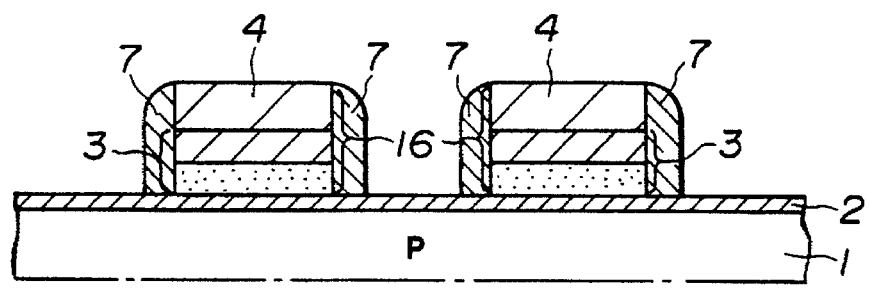
FIG. 17 is a view for explaining a process of forming a sidewall in the method of manufacturing a semiconductor device according to the second embodiment of the present invention.

After $SiO_2$ or TEOS is deposited with a thickness of 100 to 150 nm on the stacked film 16, etching back is carried out using a $CF_4/O_2$ to form a sidewall 7, as shown in FIG. 17. Even though the antireflection layer 5 remains at the stage shown in FIG. 16, it can be removed substantially perfectly by overetching in the etching back.

Figure 18:
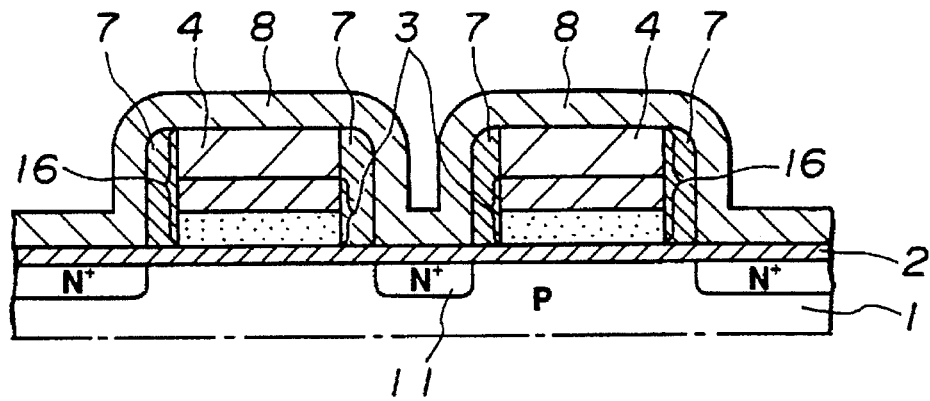
FIG. 18 is a view for explaining a process of forming an interlayer insulating layer after forming an impurity diffused region in the method of manufacturing a semiconductor device according to the second embodiment of the present invention.

Then, n-type impurities such as phosphorus (P) ions are implanted selectively in a required region of the region surrounded by the sidewall V as shown in FIG. 18, to form an n-type impurity diffused region 11 on the surface of the silicon substrate 1 in the required region. An interlayer insulating layer 8 is then formed on the entire surface thereof.

Figure 19:
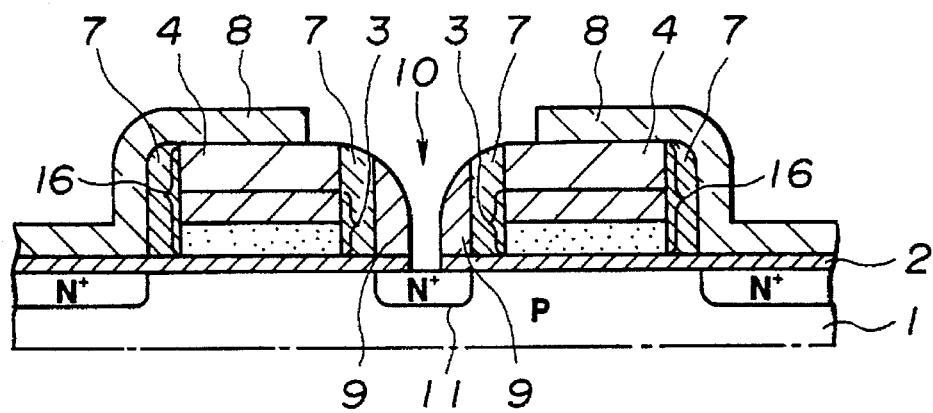
FIG. 19 is a view for explaining a process of forming a contact hole in the method of manufacturing a semiconductor device according to the second embodiment of the present invention.

After a resist, not shown, is formed on the interlayer insulating layer 8 as shown in FIG. 19, patterning is carried out by lithography to form an opening in a position corresponding to a portion for a contact hole. Then, a portion exposed from the opening in the resist is etched by RIE using a $CF4/O_2$ gas. At this point, a second sidewall 9 is formed on the inner side of the sidewall 7, and simultaneously a contact hole 10 extending to the silicon substrate i is formed in a self-aligned manner.

Figure 20:
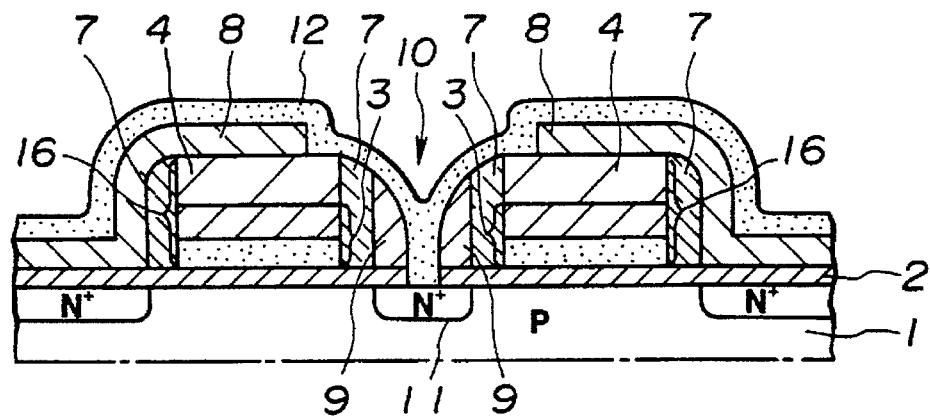
FIG. 20 is a view for explaining a process of forming a second electrically conductive interconnection layer, that is, a view of a semiconductor device finally produced, in the method of manufacturing a semiconductor device according to the second embodiment of the present invention.

Finally, after the natural oxidation film is removed with hydrofluoric acid in pre-processing, a second electrically conductive interconnection layer 12 is formed by the CVD method, to form a semiconductor device of the second embodiment, as shown in FIG. 20.

According to the present second embodiment, since the antireflection layer 5 is formed on the offset oxidation film 4 formed on the first electrically conductive interconnection layer 3, the antireflection layer 5 is not optically transformed by the formation of the offset oxidation film 4.

Also, since the resist is provided on the antireflection layer 5 in patterning the antireflection layer 5 and the underlying offset oxidation film 4, the standing wave can be restricted and satisfactory patterning can be carried out.

As the antireflection layer 5 can be removed in removing the first electrically conductive interconnection layer 3 with the remaining antireflection layer 5 as the mask, hydrogen and water contained in the antireflection layer 5 are eliminated so that deterioration in properties of devices such as a transistor can be prevented.

It is to be understood that the method of manufacturing the semiconductor device according to the present invention is not limited to the first and second embodiments. For instance, an $Si_xN_y$ film formed by the plasma CVD method may be used as the antireflection layer.

What is claimed is:

1. A method of making a self-aligning contact hole in a semiconductor device with multi-layer interconnections, comprising the steps of:

forming a first electrically conductive interconnection layer on a first insulating layer formed on a lower interconnection layer;

forming a second insulating layer on the first electrically conductive interconnection layer;

forming an antireflection layer on the second insulating layer;

patterning the first electrically conductive interconnection layer, the second insulating layer and the antireflection layer to form a stacked film composed of the first electrically conductive interconnection layer, the second insulating layer and the antireflection layer;

depositing a third insulating layer and etching back to form a sidewall on the stacked film;

forming an interlayer insulating layer on an entire surface of the stacked film having the sidewall formed thereon and the first insulating layer;

patterning the interlayer insulating layer to define a contact hole region and, using the antireflection layer as an etching stopper, etching by RIE to form a self-aligning contact hole to expose a selected portion of the lower interconnection layer using the sidewall as a mask; and depositing a second electrically conductive interconnection layer in the contact hole at the exposed portion of the lower interconnection layer.

2. The method of manufacturing a semiconductor device as claimed in claim 1, wherein the lower interconnection layer is an impurity diffused region formed by introducing impurities into a semiconductor substrate.

3. The method of manufacturing a semiconductor device as claimed in claim 1, wherein the antireflection layer is an $Si_xO_yN_z$ film or an $Si_xN_y$ film formed by plasma CVD.

4. The method of manufacturing a semiconductor device as claimed in claim 1, wherein the antireflection layer is an $Si_xO_yN_z$ film or an $Si_xN_y$ film having a real part of refractive index n=2.4±0.6 and an imaginary part of refractive index k=0.7±0.2.

5. The method of manufacturing a semiconductor device as claimed in claim 1, wherein the first electrically conductive interconnection layer is a polycide layer having silicide and a polycrystalline silicon layer stacked thereon.

6. A method as defined in claim 1, wherein said second insulating layer is an offset oxide film comprising $Si_xO_yN_z$.

* * * * *